United States Patent [19]

Hasegawa et al.

[11] Patent Number: 5,894,982
[45] Date of Patent: Apr. 20, 1999

[54] CONNECTING APPARATUS

[75] Inventors: Tatsuya Hasegawa, Himeji; Satoshi Yoshimura, Hyogo-ken; Toshiaki Miyoshi, Hyogo-ken; Yasunori Fukumoto, Hyogo; Yoshikazu Yomogihara, Himeji, all of Japan

[73] Assignee: Kabushiki Kaisha Toshiba, Kawasaki, Japan

[21] Appl. No.: 08/720,137

[22] Filed: Sep. 27, 1996

[30] Foreign Application Priority Data

Sep. 29, 1995 [JP] Japan .................. 7-253739
Sep. 29, 1995 [JP] Japan .................. 7-253740

[51] Int. Cl.$^6$ .................................. B23K 31/12
[52] U.S. Cl. .................. 228/106; 219/56.21; 219/243; 228/6.2; 228/44.7; 228/45
[58] Field of Search .................. 228/45, 44.7, 6.2; 219/56.21, 243, 244, 254, 259

[56] References Cited

U.S. PATENT DOCUMENTS

| | | | |
|---|---|---|---|
| 3,216,640 | 11/1965 | Szasz | 228/44.7 |
| 3,263,057 | 7/1966 | Conti | 219/56.21 |
| 4,010,885 | 3/1977 | Keizer et al. | 228/4 |
| 5,372,292 | 12/1994 | Sato et al. | 228/44.7 |

*Primary Examiner*—Patrick Ryan
*Assistant Examiner*—Kiley Stoner
*Attorney, Agent, or Firm*—Pillsbury Madison & Sutro LLP

[57] ABSTRACT

A heater tool, which bonds by thermocompression outer leads of a TCP to electrodes on an array substrate, is fixed to a support block and is movable between a compression-bonding position, wherein the distal end portion of the heater tool presses the TCP to compression-bond the outer leads to the electrodes of the array substrate, and a waiting position wherein the distal end portion is spaced apart from the TCP. A pressing mechanism having a pressing member is mounted on the support block and movable in interlock with the movement of the heater tool. The pressing member presses the TCP to press the outer leads against the array substrate when the heater tool moves from the waiting position toward the compression bonding position.

8 Claims, 9 Drawing Sheets

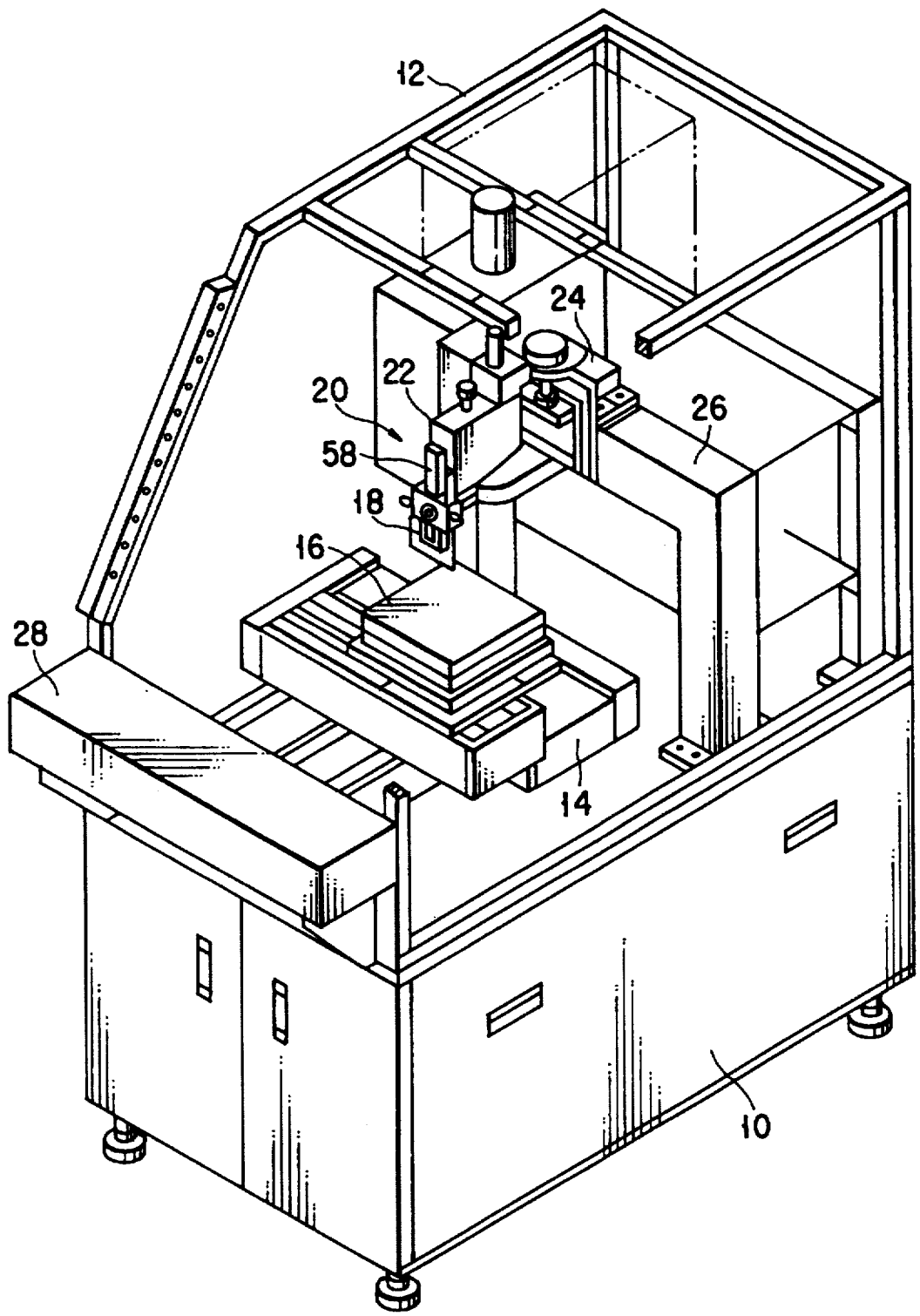
F I G. 1

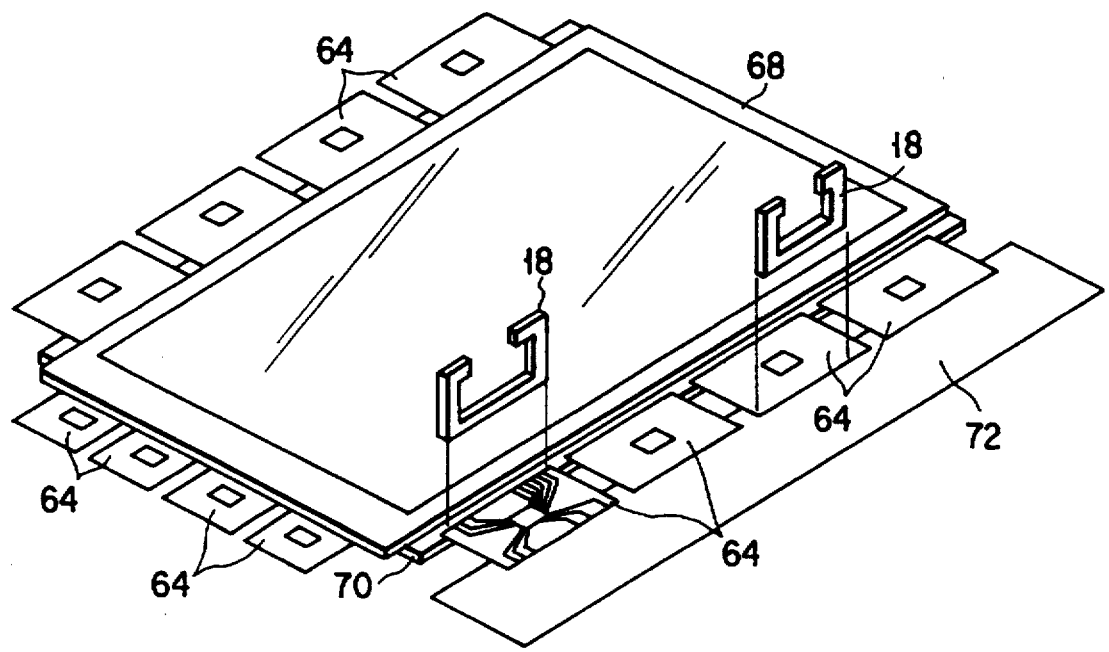
F I G. 6
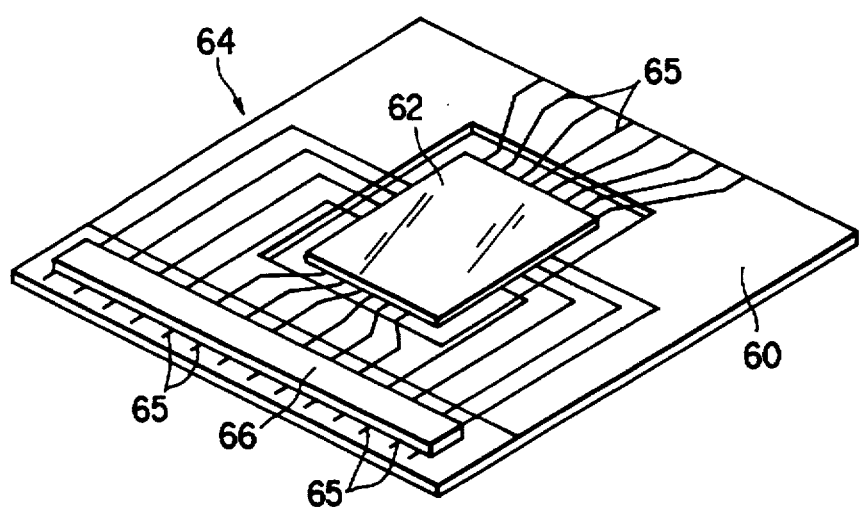
F I G. 7

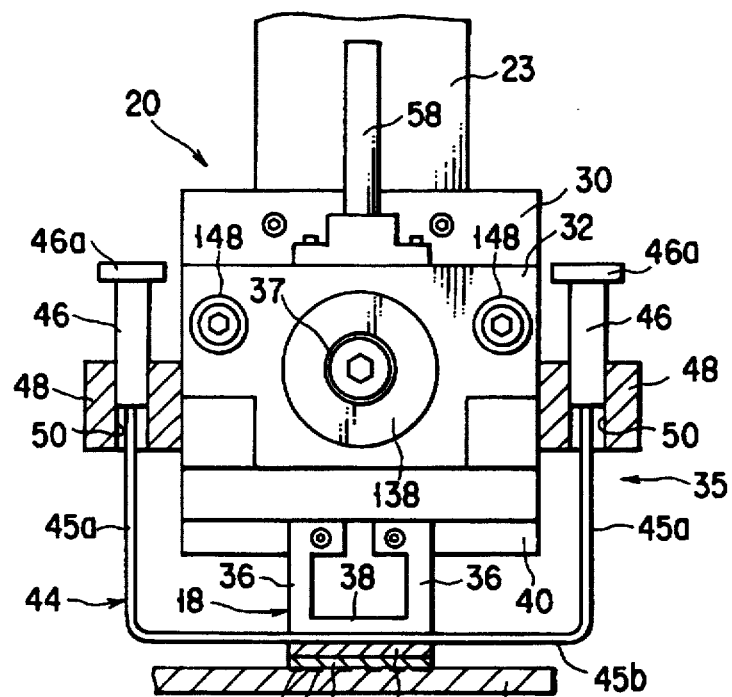
F I G. 8A
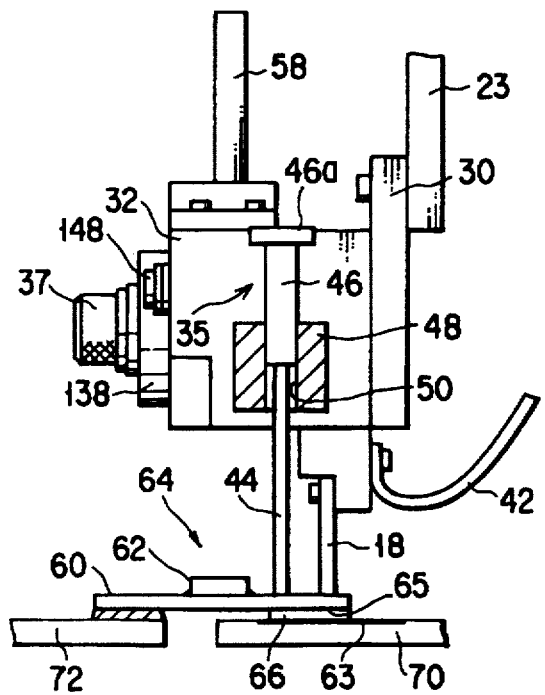
F I G. 8B

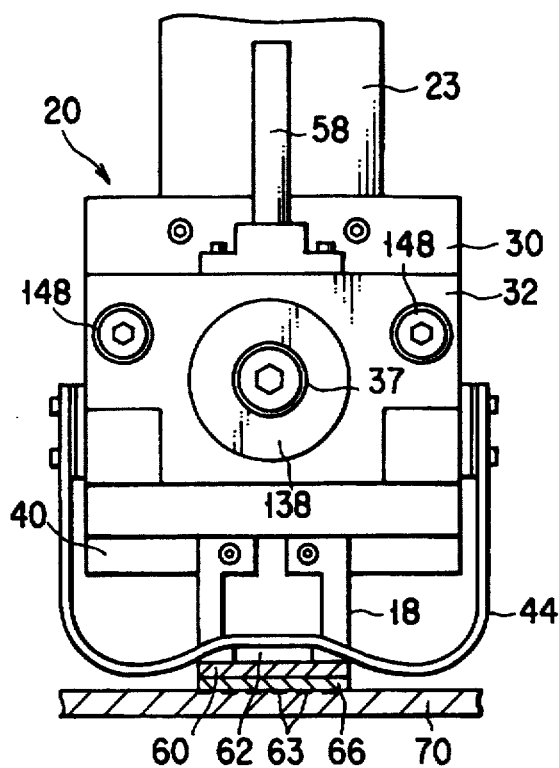
F I G. 10A
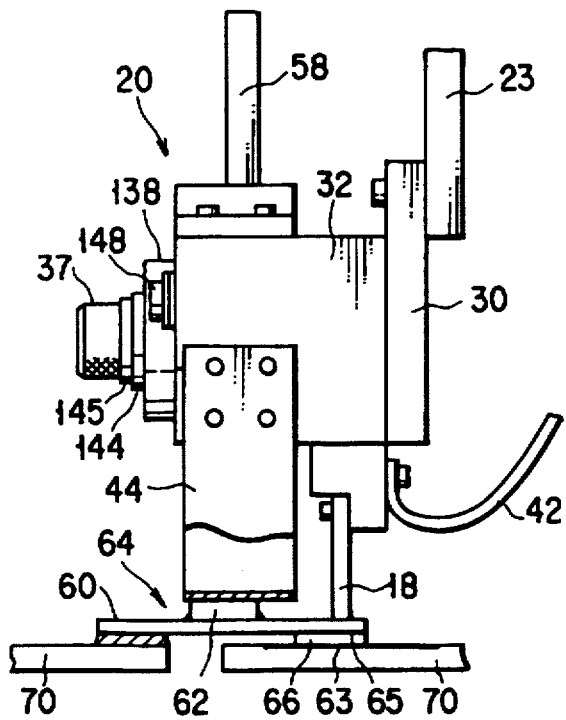
F I G. 10B

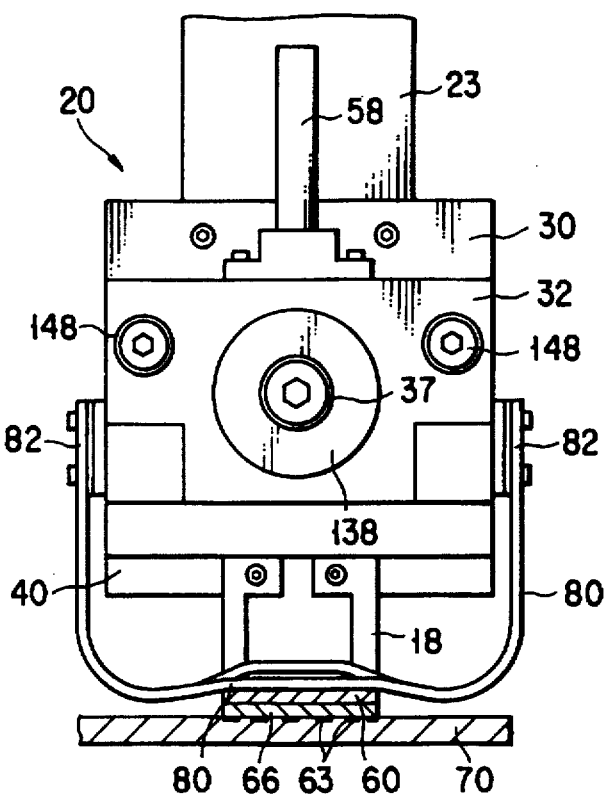
F I G. 12A
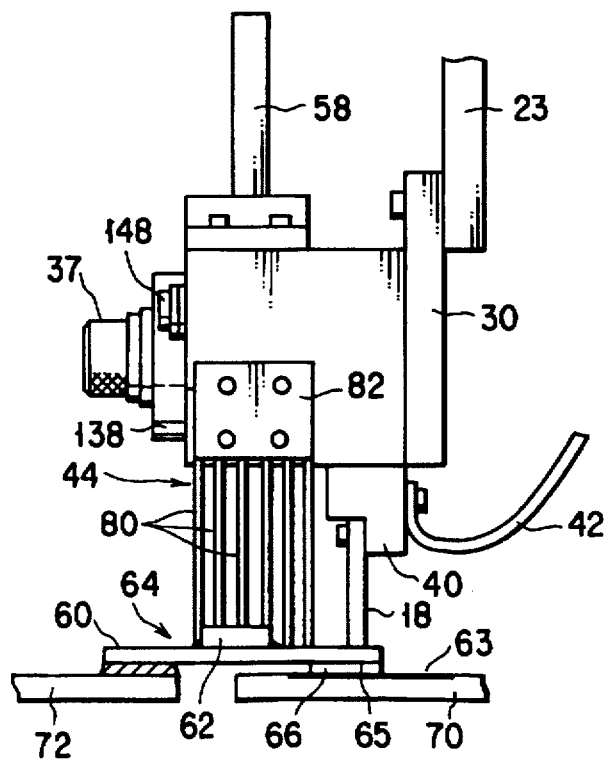
F I G. 12B

CONNECTING APPARATUS

BACKGROUND OF THE INVENTION

1. Field of the Invention

The present invention relates to a connecting apparatus such as a thermocompression bonding apparatus, which is used for, e.g., connecting an electrode substrate of a liquid crystal display and a printed circuit board mounted with electronic parts.

2. Description of the Related Art

Utilizing the features characterized by thinness, light weight and low electricity consumption, a flat panel display, represented by a liquid crystal display, has been recently used widely in such applications as display for personal computer, word processor, television and the like or as display for projection.

Among the flat panel displays, an active matrix type liquid crystal display, which comprises pixel electrodes and switching elements electrically connected thereto, has become the target of intensive research and development, because such display provides a good display image free of cross talks between the adjacent pixels.

Generally, an active matrix type liquid crystal display has an array substrate and an opposing substrate, which are positioned opposite to each other, and a liquid crystal composition is filled in the space between the substrates via an orientation layer. The array substrate has a glass substrate on which a plurality of signal lines and a plurality of scanning lines are arranged in a matrix and pixel electrodes are positioned via thin film transistors (hereinafter referred to as TFT), functioning as switching elements, in the neighborhood of each of the cross sections between the signal lines and the scanning lines. On the glass substrate, storage capacitor lines are provided in parallel to the scanning lines and insulating layers are provided between the scanning lines and the pixel electrodes so that storage capacitor is formed between the storage capacitor lines and the pixel electrodes.

The counter substrate has a glass substrate on which a matrix-shaped shading layer for shading the TFTs and the neighborhood of the pixel electrodes is formed, and a transparent counter electrode is positioned on the shading layer via an insulating layer.

Each of the signal lines and each of the scanning lines on the array substrate are electrically connected to a drive circuit board, which drives or controls the display panel, through a tape carrier package (hereinafter referred to as TCP) which comprises a driving element mounted on a flexible printed circuit board. The flexible printed circuit board has an insulating sheet formed of a heat-resistant material such as polyimide, and conductive lines formed on the insulating sheet.

Generally, the connection between the array substrate and the TCPs is made by the thermocompression bonding by use of a thermocompression bonding apparatus while an anisotropic conductive film that has a bonding resin containing electroconductive particle dispersed therein is sandwiched between the array substrate and the TCP.

The thermocompressing apparatus is equipped with a thermocompressing head which, while kept in a heated state, presses the lead portion of the TCP from above. Generally, the thermocompression head is equipped with a U-shaped heater tool comprising a pair of parallel legs and a distal end portion that couples the two legs at one ends. The distal end portion of the heater tool is pressed against the end portion of the TCP and the array substrate in a parallel manner.

In order to assure the compression bonding of all of many outer leads of the TCP to the electrodes of the array substrate by means of the above-mentioned thermocompressing head, it is necessary to uniformly press the outer leads of the TCP by means of the heater tool. That is, where the distal end portion of the heater tool has an inclination to the array substrate, part of the outer leads is not sufficiently pressed by the heater tool and, as a result, a connection failure can occur. The degree of parallel of the distal end portion of the heater tool may change at the time of exchange of the heater tool and, in addition, it may vary with time during the use of the thermocompression bonding apparatus.

Therefore, generally, the thermocompressing bonding apparatus has an adjusting mechanism for adjusting the degree of parallel of the distal end portion of the heater tool. The adjusting mechanism has a construction that a heater tool is attached to a support block which is rotatably mounted on a base so that the degree of parallel of the heater tool may be adjusted by rotating the heater tool together with the support block.

Heretofore, the constructions, which rotatably hold the support block, include a construction that utilizes a screw as the rotation shaft for the support block, a construction that holds the rotation shaft of the support block via bearing, and a construction in which the support block and the base each have a spherical support surface so that the spherical surfaces are slidably engaged with each other.

However, the support mechanism that utilizes a screw as a rotation shaft has looseness in the tapped hole which is formed in the support block and therefore the degree of parallel of the distal end portion of the heater tool tend to vary. And, the support mechanism that utilizes bearings tends to cause the variation of the degree of parallel due to the looseness of the bearings. Accordingly, a lot of time is necessary for the adjustment of the degree of parallel with a high-level of precision by means of the above-mentioned adjusting mechanism.

Meanwhile, in the adjusting mechanism that has spherical support surfaces, the problem is that the spherical surface preparation requires a high-level precision and it is very difficult to prepare a looseness-free support surface. As a result, the production cost is high.

Further, as a conventional adjustment mechanism, there is provided a mechanism wherein a movable portion of a micrometer is secured to a support block and the rotating amount of the support block is adjusted by means of the micrometer. However, the problem is that, since a large load is impressed on the micrometer at the time of adjusting operation, the precisely created screw threads easily deform thereby making it difficult to carry out highly precise adjustment.

Recently, a folded TCP has been increasingly used. The folded TCP has relatively long distance between the driving element and the outer lead ends and incorporated into a liquid crystal display while part of the flexible printed circuit board is in a folded state. In this folded TCP, the end portion of the flexible printed circuit board deforms three-dimensionally, for example in the shape of wave, depending on the case.

When the wave-like end portion of the TCP are superimposed over the predetermined location of the array substrate, the outer leads of the TCP do not make a uniform contact with the array substrate thereby producing partial lifting. Therefore, when the deformed end portion is subjected to the thermocompressing bonding treatment by means of the heat tool, the lifted portion is stretched owing to the pressing action of the heat tool thereby causing location error from the array substrate. As a result, it is difficult to precisely connect each of the outer leads to the corresponding electrode on the array substrate.

On the other hand, when carrying out the thermocompression bonding of the outer lead portion of the TCP to the electrodes on a circuit board by use of solder, there is a risk that connection failure may occur due to the lifting of the outer lead portion, because the heater tool is pulled up while the solder is in a molten state after the heater tool is pressed against the outer lead portion.

SUMMARY OF THE INVENTION

The present invention has been made from the above-mentioned circumstances, and its object is to provide a connecting apparatus which can securely connect a member to be connected to a predetermined location.

Another object of the present invention is to provide a connecting apparatus which has a heater tool and which can easily and highly precisely adjust the degree of parallel of the heater tool.

In order to achieve the above-identified object, the connecting apparatus according to the present invention comprises a heater tool having a distal end portion for abutting against the bonding portion of the first member; moving means for moving the heater tool between a compression bonding position, where the distal end portion of the heater tool presses and compression-bonds a bonding portion of a first member to a predetermined portion of a second member, and a waiting position, wherein the distal end portion of the heater tool is spaced apart from the bonding portion; and pressing means arranged to be movable in interlock with the heater tool, for pressing that portion of the first member which is adjacent to the bonding portion against the second member when the heater tool moves from the waiting position to the compression bonding position.

According to the connecting apparatus of the above-described construction, when the bonding portion of the first member is thermally compression-bonded to a predetermined portion of the second member, the pressing means abuts against the vicinity of the bonding portion of the first member to press the bonding portion to the predetermined portion of the second member, as the heater tool is lowered from the waiting position to the compression bonding position. Under this condition, the heater tool is lowered to the compression bonding position and presses the bonding portion to the predetermined portion with heat thus carrying out the thermocompressing bonding.

The pressing means is equipped with an elastic member which abuts against the first member at the vicinity of the bonding portion to uniformly press the bonding portion to the predetermined portion. The examples of the elastic member include a belt type or wire type elastic member suspended from a support block to which the heater tool is fixed.

According to another aspect of the present invention, the pressing means is provided with a pressing member having a pressing portion. The pressing member is attached to the support block, to which the heater tool is fixed, in a relatively movable manner. And, when the pressing portion of the pressing member abuts against the vicinity of the bonding portion, the weight of the pressurizing member that is attached to the pressing member is impressed on the pressing portion as a pressing force.

In addition, a connecting of the present invention comprises a heater tool having a flat distal end portion for abutting against the bonding portion of the member; a support block supporting the heater tool; supporting means for rotatably supporting the support block; and adjusting means for adjusting the rotating position of the support block to adjust the degree of parallel of the distal end portion of the heater tool with respect to the bonding portion.

The supporting means includes: a base, a through hole formed in the support block, a support sleeve slidably inserted into the through hole with a predetermined fit, a support shaft slidably inserted into the sleeve with a predetermined fit and fixing the support sleeve to the base, urging means arranged between the support sleeve and the support block, for urging the support block against the base, and locking means for locking the support block to any position of rotation.

According to the construction of the above-described connecting apparatus, the procedure for adjusting the degree of parallel of the distal end portion of the heater tool comprises the steps of unlocking the locking means and then rotating the support block together with the heater tool little by little utilizing the adjusting means to attain the desired adjustment. In this case, since the support block and the support sleeve are engaged with each other in a predetermined fit without intervening screw or bearing therebetween, no looseness occurs thereby enabling a quick and high-precision adjustment of the degree of parallel. Besides, the looseness of the support block in the axial direction of the support sleeve is prevented by the urging means. And, after the adjustment of the degree of parallel, the support block is locked again by the locking means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1 to 5 and FIGS. 8A and 8B illustrate a thermocompression bonding apparatus according to a first embodiment of the present invention, in which:

FIG. 1 is a perspective view showing the outline of the overall thermocompression bonding apparatus with parts broken away, FIG. 2 is a front view of a head unit of the thermocompression bonding apparatus, FIG. 3 is a side view of the head unit, FIG. 4 is a cross-sectional view taken along a line IV—IV of FIG. 2, FIG. 5 is a cross-sectional view taken along a line V—V of FIG. 2, FIG. 6 is a perspective view showing a liquid crystal panel, TCP and a driving circuit board joined together by the thermocompression bonding apparatus, FIG. 7 is an enlarged perspective view of the above-mentioned TCP, and FIGS. 8A and 8B are a front view and a side view, respectively, of the head unit which has been lowered to a thermocompression bonding position;

FIGS. 9A to 10B illustrate a thermocompression bonding apparatus according to a second embodiment of the present invention, in which:

FIGS. 9A and 9B are a front view and a sectional view, respectively, of a head unit in a waiting position of the thermocompression bonding apparatus, and FIGS. 10A and 10B are a front view and a side view, respectively, of the head unit which has been lowered to a thermocompression bonding position;

FIGS. 11A to 12B illustrate a thermocompression bonding apparatus according to a third embodiment of the present invention, in which:

FIGS. 11A and 11B are a front view and a sectional view, respectively, of a head unit in a waiting position of the thermocompression bonding apparatus, and FIGS. 12A and 12B are a front view and a side view, respectively, of the head unit which has been lowered to a thermocompression bonding position.

DETAILED DESCRIPTION OF THE PREFERRED EMBODIMENTS

Figure 2:
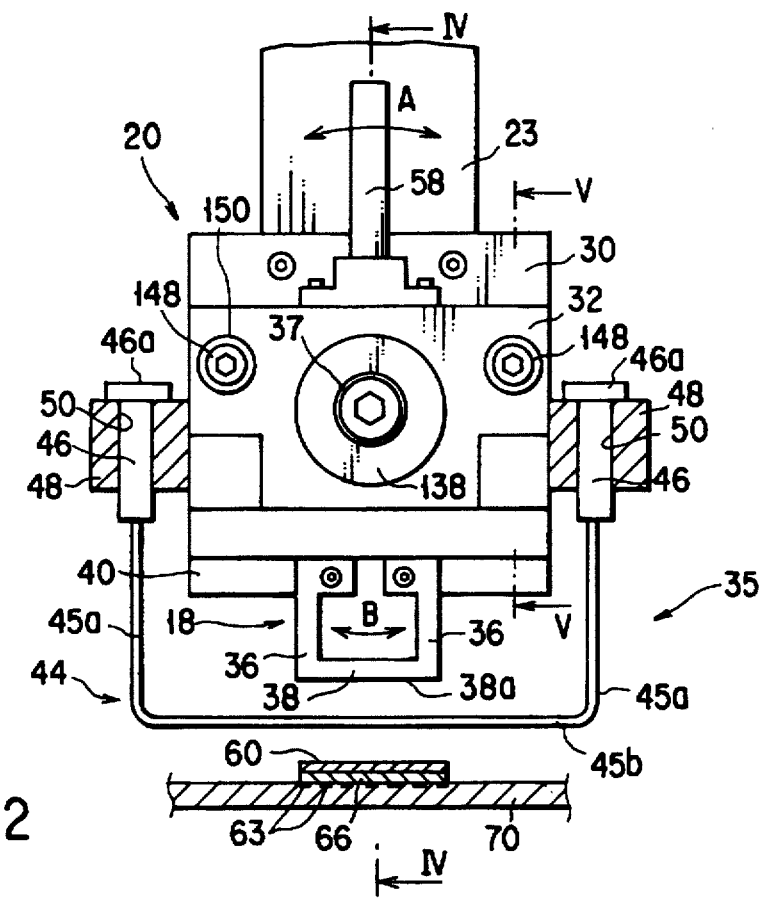

Embodiments of the present invention will now be explained in detail with reference to the accompanying drawings.

FIG. 1 illustrates the outline of the overall thermocompression bonding apparatus according to an embodiment to be used for the manufacture of liquid crystal displays.

As illustrated in FIG. 1, the thermocompression bonding apparatus has a base 10 and a support frame 12 mounted on the base. On the base 10, an X-Y table 14 is placed and a stage 16, on which a liquid crystal display panel or the like as an article to be worked will be placed, is mounted on the X-Y table.

Above the stage 16, positioned is a head unit 20 equipped with a heater tool 18 that will be described later. The head unit 20 is fixed to a movable plate 24 via an air cylinder 22 that functions as moving means. The movable plate 24 is placed on the horizontal frame 26 of the support frame 12, which extends horizontally above the stage 16. Based on this mechanism, the head unit 20 can ascend or descend in relation to the stage 16.

In front of the support frame 12 are provided a control panel 28 which controls the operation of the X-Y table 14, the air cylinder 22, the heater tool 18, etc.

As illustrated in FIGS. 2 to 5, the head unit 20 comprises a plate-shaped base 30, which is secured to the air cylinder 22 via a connecting plate 23, a rectangular support block 32, the heater tool 18 secured to the support block, and a pressing mechanism 35 serving as pressing means.

The support block 32 has in the center thereof a through hole 34 having a circular cross section, which opens at the front face 32a and at the rear face 32b of the support block. A cylindrical sleeve 136 is inserted into the through hole 34 form the front side of the support block 32. The sleeve 136 has an outer diameter in a predetermined relation to the diameter of the through hole 34 so that the sleeve slidably and rotatably inserted into the through hole 134 with a predetermined fit such as a sliding fit, without looseness.

One end of the support sleeve 136 projects from the rear face 32b of the support block 32 and engaged with the base 30. The other end of the support sleeve 136 has a flange 138 which faces the front face 32a of the support block 32 with a predetermined space therebetween.

A support shaft 140 is inserted into the support sleeve 136 from the side of the flange 138. The support shaft 140 is fitted into the inner hole of the support sleeve 136 with a predetermined fit such as a loose fit so that the support shaft is slidable and rotatable in relation to the support sleeve. One end of the support shaft 140 has a threaded portion 141 which projects from the support sleeve 136 and screwed into the base 30. The other end of the support shaft 140 forms a head portion 37 which project from the support sleeve and has a diameter larger than that of the inner hole of the support sleeve. The head portion 37 abuts against the flange 138 via a flat washer 144 and a spring washer 145.

The support sleeve 136 is securely fixed to the base 30 by screwing the threaded portion 141 into the base 30 using the head portion 37. And, the support block 32 is rotatably supported by the support sleeve 136.

Between the flange 138 of the support sleeve 136 and the front face 32a of the support block 32, there are provided a pair of disk springs 146 fitted on the outer periphery of the support sleeve 136. The disk springs 146 serve as urging means. By means of the disk spring 146, the support block 32 is urged against the base 30 so that the back face 32b tightly contacts with the base 30. Because of this structure, the looseness in the support block 32 in the axial direction of the support sleeve 136 is minimized.

A pair of clamp screw 148, functioning as locking means, are passed into through holes 154, which are formed in the support block 32, from the front side of the support block and screwed into the base 30. Each of the through holes 154 has an arcuated cross section around the axis of the support shaft 140. By fastening these clamp screws 148, the support block 32 is locked at the predetermined rotating position. A flat washer 151 and a spring washer 150 are clamped between the head of each of the clamp screws 148 and the front face 32a of the support block 32.

Incidentally, the base 30, the support sleeve 136, the support shaft 140, the disk springs 146 and the clamp screws 148 constitute supporting means in the present invention.

Meanwhile, the heater tool 18 has a pair of legs 36, which are parallel to each other with a predetermined distance therebetween and which serve as power supply terminals, and a distal end portion 38 which connects end portions of these legs, thus forming a nearly U-shaped configuration. The bottom surface 38a of the distal end portion 38 is flat and extends horizontally. The heater tool 18 is made, for example, of iron and the distal end portion 38 is formed sufficiently thin to have the highest electric resistance. The width of the distal end portion 38 is about 20–30 mm.

The heater tool 18 is detachably fixed to the support block 32 by securing the pair of legs 36 with screw to a shank 40 which is fixed to the under surface of the support block 32. The shank 40 is made of an electroconductive material, for example gold-plated copper, and is connected to a pulse electric power source 41 via an electric current supply line 42. The pulse current from the pulse electric power source 41 passes to the pair of legs 36 of the heater tool 18 via the shank 40 to cause the distal end portion 38, which has a high electric resistance, to be instantly heated.

An adjusting lever 58, which functions as adjusting means, is connected to the upper surface of the support block 32 via bracket and extends in the radial direction of the support sleeve 136. The length of the adjusting lever 58 is set, for example, in a range of 80–150 mm. Pushing the extended end of the adjusting lever 58 causes the support block 32 to rotate about the support sleeve 136, and, as a result, the heater tool 18 rotates together with the support block thereby enabling to adjust the degree of parallel of the distal end portion 38 of the heater tool 18 with respect to a bonding portion of a member to be compression-bonded as will be described later.

The pressing mechanism 35 has a pressing member 44 that is formed, for example, by bending a wire of 0.8 mm diameter in a substantially U-shaped configuration. The pressing member 44 has a pair of vertical portions 45a, which extend in the ascending/descending direction of the heater tool 18, i.e., in a substantially vertical direction, and a pressing portion 45b which connects the lower ends of the vertical portions with each other and extends horizontally.

A pressurizing member 46 formed of a columnar weight is fixed to the upper end of each vertical portion 45a and extends vertically. The weight of each pressurizing member 46 is set, for example, to about 40 g. The weight of the pressurizing member 46 may be adjusted in accordance with the size or type of a member to be bonded by the apparatus. A bracket 48 is fixed to each side of the support block 32. The bracket 48 has a through hole 50 extending in the vertical direction, and the pressurizing member 46 is slidably inserted into the through hole 50. The upper end of each pressurizing member 46 forms a flange 46a which functions as a stopper.

Accordingly, the pressing member 44 is supported by the brackets 48 via a pair of pressurizing members 46 to be vertically movable, that is, movable in the moving direction of the heater tool 18. The pressing member 44 is normally held in a lowered position where the flanges 46a abuts against the corresponding brackets 48 and the pressing portion 45b is positioned in a location obliquely under the heater tool 18.

A bonding operation of the thermocompression bonding apparatus constructed as described above will be explained. There will be described in a case, for example, wherein a TCP 64 is connected to an array substrate 70 of a liquid crystal display panel 68, and a driving circuit board 72 is connected to the TCP. The TCP 64 constitute a first member and the array substrate 70 constitute a second member.

As shown in FIG. 7, a TCP 64, which comprises a driving element 62 mounted on a flexible printed circuit board 60, is prepared first, and then an anisotropic conductive film (hereinafter referred to as ACF) 66 is adhered onto a number of outer leads 65 provided on one end of the TCP. The ACF 66 is made, for example, by dispersing electroconductive particles, such as particles of nickel and solder, in a thermosetting resin and is provided in a form of sheet. The ACF 66 may be adhered onto the array substrate 70 instead of the TCP 64.

Then, one end of the TCP 64 is superimposed over the array substrate 70 while the anisotropic conductive film 66 is interposed therebetween and the outer leads 65 of the TCP are exactly aligned with a plurality of predetermined electrodes 63 on the array substrate 70. The combination of the liquid crystal display panel 68 and TCP 64, thus prepared is mounted on the stage 16 of the thermocompression bonding apparatus.

Figure 3:
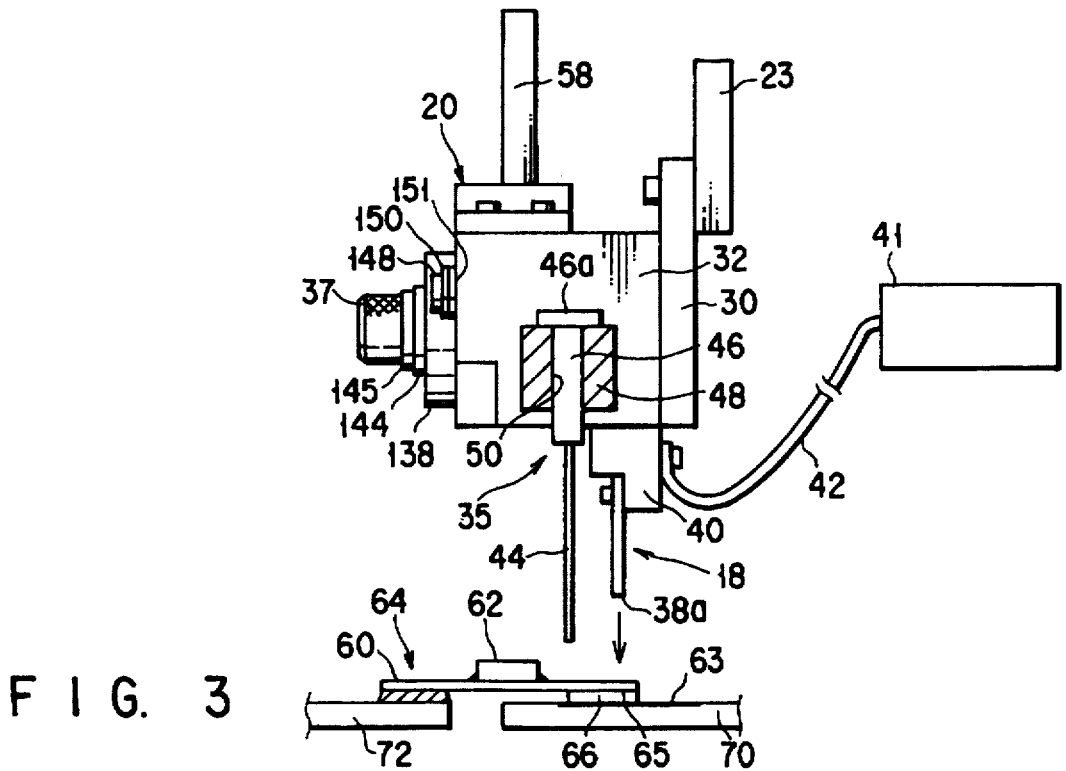
Figure 4:
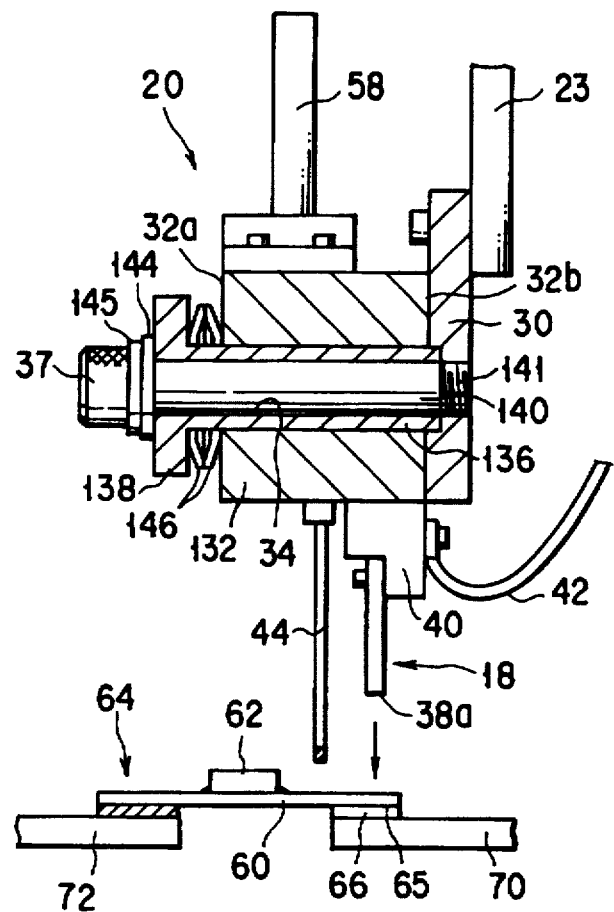
Figure 5:
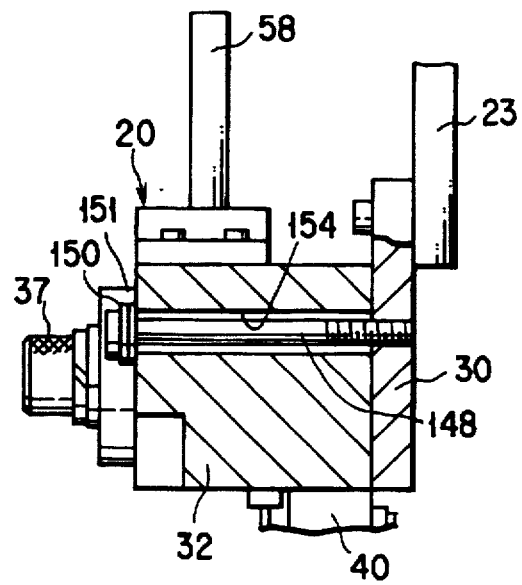
Figure 9A:
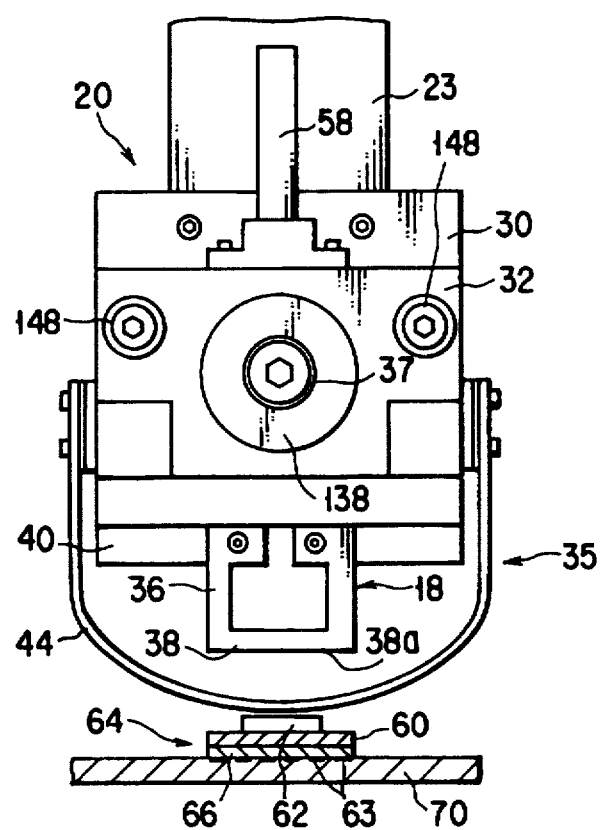
Figure 9B:
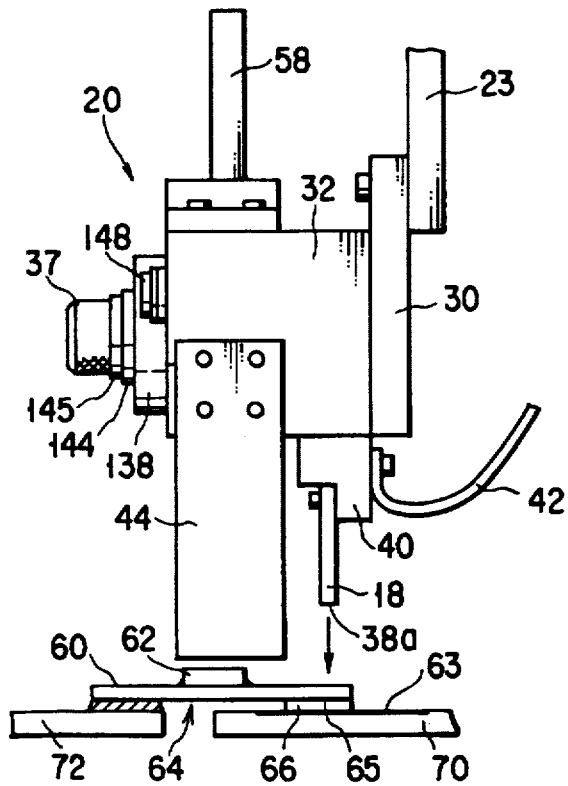
Figure 11A:
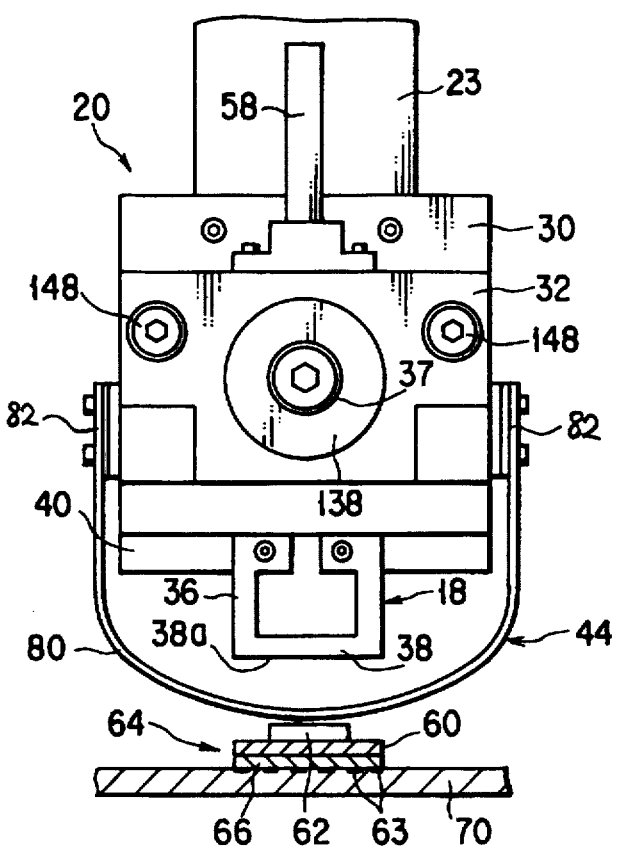
Figure 11B:
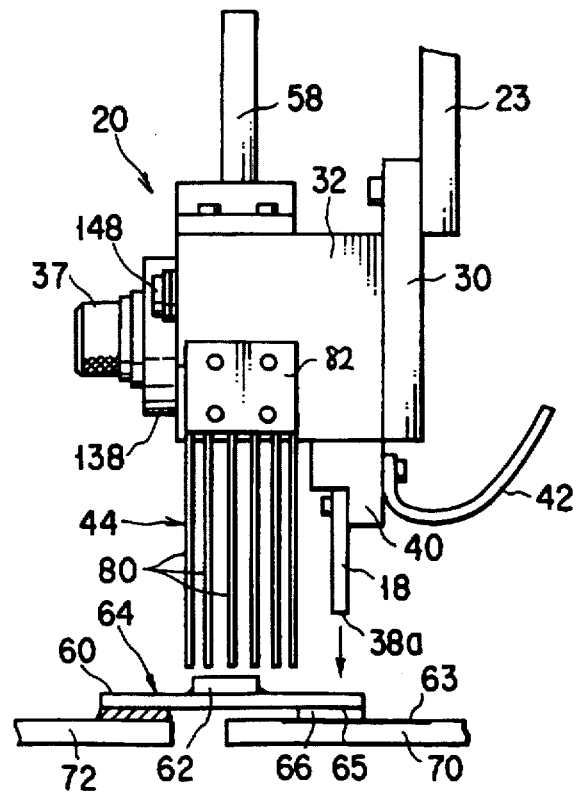

As shown in FIGS. 2 and 3, the X-Y table is actuated through the control panel 28 to move the stage 16 to the position where the joint between the liquid crystal display panel 68 and the TCP 64 is aligned with the distal end portion 38 of the heater tool 18. In this condition, the support block 30 of the head unit 20 is positioned in an elevated position and the heater tool 18 is in a waiting position wherein the distal end portion 38 is spaced apart from the TCP 64. The pressing mechanism 35 is held in an elevated position, and the pressing portion 45b of the pressing member 44 is positioned in parallel facing the surface of the array substrate 70 in the neighborhood of the outer leads 65 of TCP 64.

When the head unit 20 is lowered by driving the air cylinder 22, as illustrated in FIGS. 8A and 8B, first, the pressing portion 45b of the pressing member 44 abuts against the upper surface of the flexible printed circuit board 60 in the neighborhood of the outer leads 65 that constitute a bonding portion. As the head unit 20 is further lowered, the flange 46a of each of the pressurizing portions 46 is separated upwardly from the bracket 48. As a result, the weight of the pressurizing portion 46 is impressed on the pressing member 44 as a pressing force, which causes pressing portion 45b to press the flexible printed circuit board 60 together with the outer leads 65 onto the surface of the array substrate 70. Owing to this action, even if the flexible printed circuit board 60 has a three-dimensional deformation, such as wrinkle or wave, in the neighborhood of the outer leads 65, the flexible printed circuit board is returned to a flat state by means of the pressing portion 45b of the pressing member 44 so that the outer leads 65 precisely aligned with the corresponding electrodes 63 on the array substrate 70 and the ACF 66 on the TCP 65 tight contacts with the array substrate 70.

Then, when the head unit 20 is further lowered and the heater tool 18 is moved to a compression bonding position, the bottom surface 38a of the distal end portion 38 of the heater tool 18 presses the flexible printed circuit board 60 from the back of the outer leads 65 with a predetermined pressure. The pressure is set, for example, in a range of 10 to 20 kg. In this condition, the pulse current is applied to the heater tool 18 at a predetermined period of time, so that the heater tool 18 is heated up. Thus, the bonding portion of the TCP 64 is thermocompression-bonded to the array substrate 70, and the outer leads 65 provided on the bonding portion are electrically connected to the corresponding electrodes 63 on the array substrate 70 through the ACF 66.

More specifically, the resin in the ACF 66 is heated to be cured thereby bonding the TCP 64 to the array substrate 70. At the same time, the electrodes 63 and the outer leads 65 of the TCP 64 are electrically connected to each other by the conductive particles dispersed in the resin of the ACF 66.

Then, when the temperature of the heater tool 18 dropped to a predetermined temperature, the head unit 20 is lifted by driving the air cylinder 22. In this case, first, the heater tool 18 separates upwardly from TCP 64. As the head unit 20 is further moved upward, the brackets 48 abut against the flanges 46a of the pressurizing portions 46 to cause the pressing member 44 to ascend together with the heater tool 18, and the pressing member 44 separates from the TCP 64.

The connection between a plurality of outer leads provided on the other end portion of the TCP 64 and the electrodes of the driving circuit board 72 is also carried out in the same manner as described above. However, in this case, solder may be used in place of the ACF 66. When using solder, a pressure, for example about 4 kg, may be applied on the heater tool 18.

Meanwhile, when carrying out the thermocompression bonding of a TCP 64 in the above-described manner, the bottom surface 38a of the heater tool 18 needs to be arranged in a parallel position with a high accuracy with respect to the surface of the array substrate 70 or to the surface of the driving circuit board 72, in order to uniformly connect a number of the outer leads 65 to the electrodes 63 on the array substrate 70 or to the electrodes on the driving circuit board 72.

Therefore, the degree of parallel of the bottom surface 38a of the heater tool 18 needs to be inspected or adjusted periodically or at the time when the heater tool 18 is exchanged.

The procedure for adjusting the degree of parallel will be explained. With reference to FIGS. 2 to 5, the pair of clamp screws 148 are loosened to unlock the support block 32 and to put the support block in a rotatable state.

Next, the distal end of the adjusting lever 58 is pressed in the direction indicated by an arrow A while keeping the bottom surface 38a of the heater tool 18 in contact, for example, with the surface of the array substrate 70. By this action, the support block 32 rotates about the support sleeve 136 in the pressed direction. As a result, the heater tool 18 rotates in the direction indicated by an arrow B and the degree of parallel of the bottom surface 38a in relation to the surface of the array substrate 70 changes. Thus, by rotating the support block 32 and the heater tool 18 little by little while pressing the adjusting lever 58, the degree of parallel of the bottom surface 38a of the heater tool 18 is adjusted.

After the completion of the adjustment, by fastening the pair of clamp screws 148, the support block 32 is secured and locked to the rotatable position, whereupon the adjusting operation is completed.

According to the thermocompression bonding apparatus having the above-described construction, the head unit 20 has a pressing mechanism 35. In a thermocompression bonding operation, the pressing portion 45b of the pressing member 44 abuts against the TCP 64 at the neighborhood of the outer leads 65 and presses the outer leads to the electrodes 63 on the array substrate 70 with a predetermined pressure, prior to the action of the heater tool 18.

Therefore, even if that portion of the TCP 64 on which the outer leads 65 are provided has a deformation, such as wrinkle or wave, the deformation can be eliminated by the press by means of the pressing member, so that the outer leads can be accurately aligned with the electrodes on the array substrate 70 and tight contact with the array substrate through the ACF. As a result, it is possible to bond by thermocompression the outer leads of TCP 64 precisely to the corresponding electrodes of the array substrate or of the driving circuit board by means of the head tool 18.

Further, with the above-described thermocompression bonding apparatus, the support sleeve 136 and the support shaft 140 are engaged with the support block with a predetermined fit, without intervening screw or bearing therebetween. In addition, the support block 32 is urged against the based 30 by means of the disk springs 146. Therefore, the support block 32 can be supported without looseness or play, and no looseness occurs when adjusting the degree of parallel. As a result, variation in parallel of the heater tool 18 can be minimized and the adjusting operation can be performed quickly and with a high-accuracy.

The adjusting lever 58, which is used in place of the conventional micrometer and the like, enables a precise adjustment and a quicker operation thereof.

FIGS. 9A to 10B illustrates a head unit 20 of a thermocompression bonding apparatus according to a second embodiment of the present invention. With the second embodiment, a pressing member 44 of a pressing mechanism 35 is formed of a belt-type elastic member such as a heat resistant resin film like a polyimide film, or a metal sheet which has a thickness of 0.3 mm or less and made of stainless steel, phosphor bronze for springs, and the like.

Both ends of the pressing member 44 are secured by screws to both sides of the support block 32. Owing to this construction, the pressing member 44 is suspended from the support block 32, and the lower end of the pressing member extends in a curved state and is located under the distal end portion 38 of the heater tool 18.

Since other construction of this embodiment is identical with that of the foregoing embodiment, the identical part is given the identical reference number and the detailed explanation thereof will be omitted.

According to the second embodiment having the above-described constitution, in a thermocompression bonding operation, when the head unit 20 is lowered by driving the air cylinder 22, first, the lower end of the pressing member 44 abuts against the driving element 62 of a TCP 64. This action causes an elastic deformation, along the driving element 62, of the lower end of the pressing member 44 so that its own elasticity presses the TCP 64 to the array substrate 70 via the driving element 62. Thus, even if the flexible printed circuit board 60 of the TCP 64 has a deformation, such as wrinkle or wave, the press by means of the pressing member 44 eliminates the deformation so that the outer leads 65 are accurately aligned with the corresponding electrodes on the array substrate and tight contact with the array substrate through a ACF 66.

Then, when the head unit 20 is further lowered, the bottom surface 38a of the distal end portion 38 of the heater tool 18 presses the flexible printed circuit board 60 from the backside of the outer leads 65 to the array substrate 70 with a predetermined pressure. In this condition, the pulse current passed from the pulse electric power source 41 heats up the heater tool 18 so that the outer leads 65 are thermocompression-bonded to the corresponding electrodes 63 on the array substrate 70.

Therefore, also in the second embodiment having the above-described constitution, as in the foregoing embodiment, even if that portion of the TCP 64 on which the outer leads 65 are provided has a deformation, such as wrinkle or wave, the outer leads 65 of the TCP 64 can be precisely bonded by means of thermocompression to the corresponding electrodes of the array substrate or of the driving circuit board.

FIGS. 11A to 12B illustrate a head unit 20 of a thermocompression bonding apparatus according to a third embodiment of the present invention. With the third embodiment, a pressing member 44 of a pressing mechanism 35 is formed of a plurality, e.g., six, of elastic wires 80.

Both ends of each of the wires 80 are secured by screws to both sides of the support block 32 via fitting plates 82, respectively. These wires 80 have each the same length and are arranged in parallel to one another thereby presenting a belt-shaped configuration as a whole. Each wire 80 is suspended from the support block 32, and the lower end of the wire 80 extend in a curved state and is located under the distal end portion 38 of the heater tool 18.

Since other construction of this embodiment is identical with that of the first embodiment, the identical part is given the identical reference number and the detailed explanation thereof will be omitted According to the third embodiment having the above-described constitution, at the time of thermocompression bonding operation, when the head unit 20 is lowered by driving the air cylinder 22, first, the lower ends of the plural wires 80 abut against the driving element 62 and the upper surface of the flexible printed circuit board 60 of a TCP 64. This action causes an elastic deformation, along the driving element 62 or along the flexible printed circuit board 60, of the lower ends of the plural wires 80 so that their own elasticity presses TCP 64 to the array substrate 70 via the driving element 62 and the flexible printed circuit board 60.

Accordingly, even if that portion of the printed circuit board 60 of TCP 64 on which the outer leads 65 are provided has a deformation, such as wrinkle or wave, the press by means of the pressing member 44 comprising the plural wires 80 eliminates the deformation so that the outer leads 65 can be accurately aligned with the corresponding electrodes 63 on the array substrate and tight contact the array substrate through a ACF 66.

Then, when the head unit 20 is further lowered and the heater tool 18 is moved to a compression-bonding position, the bottom surface 38a of the distal end portion 38 of the heater tool 18 presses the flexible printed circuit board 60 from the back side of the outer leads 65 to the array substrate 70 with a predetermined pressure. In this condition, the pulse current passed from the pulse electric power source 41 heats up the heater tool 18 so that the outer leads 65 are thermocompression-bonded to the corresponding electrodes 63 on the array substrate 70.

Therefore, also in the third embodiment having the above-described constitution, as in the foregoing embodiments, even if the TCP 64 has a deformation, such as wrinkle or wave, the outer leads 65 of the TCP 64 can be precisely bonded by means of thermocompression to the corresponding electrodes of the array substrate or of the driving circuit board. Particularly, with this embodiment, since the TCP 64 is pressed at a plurality of locations, the deformation of the flexible printed circuit board 60 can be more surely eliminated and therefore a more precise thermocompression bonding is possible.

The present invention is not limited to the above-described embodiments, and a various modifications can be applied within the scope of the present invention. For example, the material of the elastic member that constitutes the pressing member is not limited to those indicated above, and such a material as rubber or sponge can be selected as necessary. Also, the shapes of the pressing member may be changed.

The dimensions of the heater tool 18, the adjusting lever 58, etc. are not limited to those indicated above and therefore can vary as necessary. The longer the adjusting lever 58 is, the more minute adjustment is possible and the easier the adjusting operation is. Where the adjusting lever interferes with other structural elements, the adjusting lever can be of a detachable type.

What is claimed is:

1. A connecting apparatus for connecting a connecting portion of a member to a predetermined location, the apparatus comprising:
    a heater tool having a flat distal end portion for abutting against the bonding portion of the member;
    a support block supporting the heater tool;
    supporting means for rotatably supporting the support block; and
    adjusting means for adjusting the rotating position of the support block to adjust the degree of parallel of the distal end portion of the heater tool with respect to the bonding portion;
    the supporting means including:
        a base,
        a through hole formed in the support block,
        a support sleeve slidably inserted into the through hole with a predetermined fit,
        a support shaft slidably inserted into the sleeve with a predetermined fit and fixing the support sleeve to the base,
        urging means arranged between the support sleeve and the support block, for urging the support block against the base, and
        locking means for locking the support block to any position of rotation.

2. A connecting apparatus according to claim 1, wherein the support sleeve has a first end engaged with the base, a second end positioned on a side of the support block opposite to the base, and a flange formed on the second end, and
    the urging means is positioned between the flange and the support block.

3. A connecting apparatus according to claim 2, wherein the urging means has a plurality of disk springs which are mounted on an outer periphery of the sleeve and located between the flange and the support block.

4. A connecting apparatus according to claim 2, wherein the support shaft has a head portion projecting from the second end of the support sleeve and a distal end screwed into the base.

5. A connecting apparatus according to claim 1, wherein the locking means has a plurality of clamp screws that are screwed into the base through the support block, a flat washer, and a spring washer which are interposed between a head portion of each of the clamp screws and the support block.

6. A connecting apparatus according to claim 1, wherein the adjusting means has an adjusting lever which extends from the support block, for rotating the support block about the support sleeve.

7. A connecting apparatus according to claim 6, wherein the adjusting lever extends from the support block in a radial direction of the support sleeve.

8. A connecting apparatus for connecting a connecting portion of a member to a predetermined location through a bonding agent such as a solder or a anisotropic conductive film, the apparatus comprising:
    a heater tool having a flat distal end portion for abutting against the bonding portion of the member;
    a support block supporting the heater tool;
    supporting means for rotatably supporting the support block; and
    adjusting means for adjusting the rotating position of the support block to adjust the degree of parallel of the distal end portion of the heater tool with respect to the bonding portion;
    the supporting means including:
        a base,
        a through hole formed in the support block,
        a support sleeve slidably inserted into the through hole with a predetermined fit,
        a support shaft slidably inserted into the sleeve with a predetermined fit and fixing the support sleeve to the base,
        urging means arranged between the support sleeve and the support block, for urging the support block against the base, and
        locking means for locking the support block to any position of rotation.

* * * * *